(12) United States Patent
McKinnon

(10) Patent No.: US 8,143,893 B2
(45) Date of Patent: Mar. 27, 2012

(54) THIN EXTENDED-CAVITY RF COIL FOR MRI

(75) Inventor: Graeme Colin McKinnon, Hartland, WI (US)

(73) Assignee: General Electric Company, Schenectady, NY (US)

( * ) Notice: Subject to any disclaimer, the term of this patent is extended or adjusted under 35 U.S.C. 154(b) by 402 days.

(21) Appl. No.: 12/415,816

(22) Filed: Mar. 31, 2009

(65) Prior Publication Data
US 2010/0244835 A1 Sep. 30, 2010

(51) Int. Cl.
*G01V 3/00* (2006.01)
(52) U.S. Cl. .......... 324/318; 324/322
(58) Field of Classification Search .......... 324/300–322; 600/407–445
See application file for complete search history.

(56) References Cited

U.S. PATENT DOCUMENTS

| | | | | |
|---|---|---|---|---|
| 5,372,137 A * | 12/1994 | Wong et al. | | 600/422 |
| 5,457,388 A * | 10/1995 | Peeren | | 324/320 |
| 5,530,353 A * | 6/1996 | Blanz | | 324/315 |
| 5,689,187 A * | 11/1997 | Marek et al. | | 324/318 |
| 6,263,229 B1 * | 7/2001 | Atalar et al. | | 600/423 |
| 6,549,800 B1 * | 4/2003 | Atalar et al. | | 600/423 |
| 6,930,482 B2 | 8/2005 | Heid et al. | | |
| 7,102,350 B2 * | 9/2006 | Weyers et al. | | 324/318 |
| 7,145,339 B2 * | 12/2006 | Saylor et al. | | 324/318 |
| 7,397,244 B2 * | 7/2008 | Cirel | | 324/318 |
| 7,443,163 B2 * | 10/2008 | Warntjes et al. | | 324/318 |
| 7,683,623 B2 * | 3/2010 | Zhai et al. | | 324/318 |
| 2010/0117642 A1 * | 5/2010 | Zhai et al. | | 324/307 |

FOREIGN PATENT DOCUMENTS

| | | | |
|---|---|---|---|
| GB | 2 424 281 A1 * | 9/2006 | |
| WO | WO 2010/045457 A2 * | 4/2010 | |

OTHER PUBLICATIONS

Beck et al.; "Geometry comparisons of an 11T coaxial reentrant cavity (ReCav coil)", Concepts in Magnetic Resonance part B, vol. 18B, pp. 24-27 (2003).
Vaughan et al.; "High frequency volume coils for clinical NMR imaging and spectroscopy", Magnetic Resonance in Medicine, vol. 32, pp. 206-218 (1994).

* cited by examiner

*Primary Examiner* — Brij Shrivastav
(74) *Attorney, Agent, or Firm* — Fletcher Yoder

(57) ABSTRACT

Systems and methods for reducing an amount of space occupied by a radio frequency coil assembly in a magnetic resonance imaging system are provided. In one embodiment, a radio frequency coil assembly for a magnetic resonance imaging system includes a radio frequency coil disposed cylindrically around a patient space and a radio frequency shield disposed cylindrically around the patient space and electrically coupled to the axial ends of the radio frequency coil. The radio frequency shield may be configured to extend behind the radio frequency coil, and the axial length of the radio frequency shield may be at least two times the axial length of the radio frequency coil.

20 Claims, 2 Drawing Sheets

THIN EXTENDED-CAVITY RF COIL FOR MRI

BACKGROUND

The subject matter disclosed herein relates generally to magnetic resonance imaging systems and, more particularly, to a radio frequency coil assembly for magnetic resonance imaging systems.

Magnetic resonance imaging (MRI) systems have become ubiquitous in the field of medical diagnostics. An MRI system may generally be cylindrical in shape and a patient may be placed within an imaging volume of the cylinder to be scanned. Based on a primary magnetic field, a radio frequency (RF) pulse, and time-varying magnetic gradient fields that interact with specific nuclear components in the patient, the MRI system may produce internal images of the patient. A radiologist may employ such images for research purposes or for diagnosis of disease.

When the patient is placed in the imaging volume of the MRI system, the patient may experience claustrophobia and/or discomfort due to the closeness of the scanner. Although techniques have been developed to increase the amount of available imaging volume space, such techniques may reduce the performance of one or more components of the MRI system.

BRIEF DESCRIPTION

Embodiments of the presently disclosed subject matter may generally relate to radio frequency coils for use in magnetic resonance imaging systems. In one embodiment, a radio frequency coil assembly for a magnetic resonance imaging system includes a radio frequency coil disposed cylindrically around a patient space and a radio frequency shield disposed cylindrically around the patient space and electrically coupled to the axial ends of the radio frequency coil. The radio frequency shield may be configured to extend behind the radio frequency coil away from the patient space, and the axial length of the radio frequency shield may be at least two times the axial length of the radio frequency coil.

In another embodiment, a magnetic resonance imaging system includes a gradient coil assembly disposed cylindrically around a patient space and a radio frequency coil assembly disposed cylindrically around the patient space and entirely within the cylinder formed by the gradient coil assembly, and the radio frequency coil assembly has a transverse length of less than two centimeters.

In a further embodiment, a magnetic resonance imaging system includes a cylindrical radio frequency coil assembly having a transverse thickness of two centimeters or less.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

Figure 1:
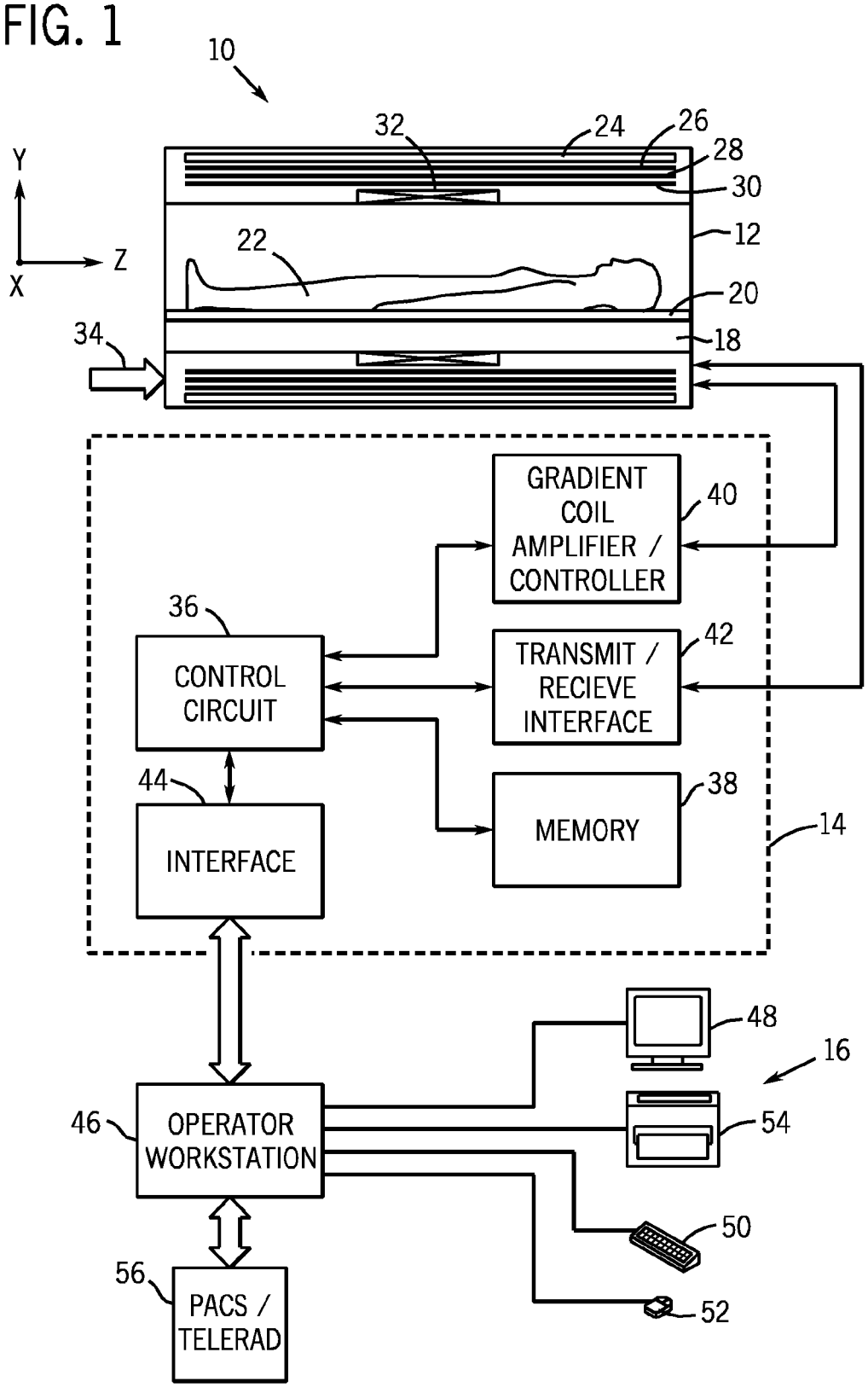
FIG. 1 is a diagrammatical representation of an MRI system for use in medical diagnostic imaging that employs a thin extended-cavity radio frequency coil, in accordance with aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The coils 26, 28, 30, and 32 of the scanner 12 may be controlled by external circuitry to generate desired pulsed fields, and to induce signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

Figure 2:
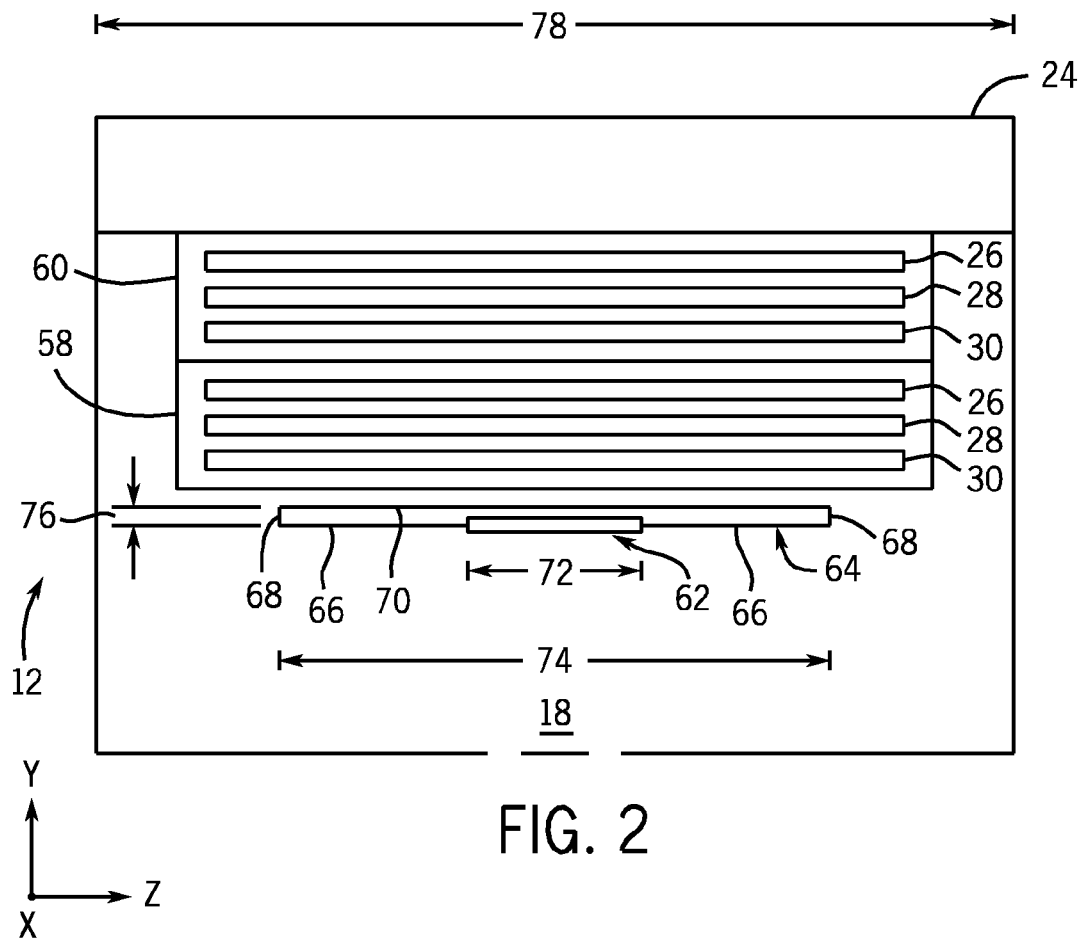
FIG. 2 is a cross-sectional view of an embodiment of a scanner of the MRI system of FIG. 1 having the thin extended-cavity radio frequency coil, in accordance with aspects of the invention.

FIG. 2 illustrates a cross-sectional view of an upper quadrant of the cylindrical scanner 12 with an embodiment of a thin extended-cavity RF body coil. As shown in FIG. 2, the RF coil assembly 32, an inner gradient coil assembly 58, an outer gradient coil assembly 60, and the main magnet 24 may be disposed cylindrically around the imaging volume 18. The inner gradient coil set 58 and the outer gradient coil set 60 may each include a z-gradient coil 26, x-gradient coil 28, and y-gradient coil 30.

The RF coil assembly 32 may include an RF coil 62 and an RF shield 64. The RF coil 62 may include a plurality of rungs made of conductive material (e.g., copper), each of which may be controlled individually by the RF transmit/receive interface 42 to transmit and/or receive RF signals. Each of the conductive rungs of the RF coil 62 may be electrically coupled to an RF shield 64 via one or more capacitive elements. To form an RF coil cavity around the RF coil 62, the RF shield 64 may include a front shield pane 66, a side shield pane 68, and a rear shield pane 70. The RF coil cavity formed by the RF shield 64 may be filled with a low dielectric material, such as a dielectric epoxy.

The RF coil 62 may have a length 72, which may be, for example, approximately 30 cm. The RF shield 64 may have a length 74, which may be greater than the RF coil length 72. For example, the RF shield length 74 may be approximately 2-3, 3-4, or 4-5 times greater than the RF coil length 72, and may be, for example, approximately 90 cm. A cavity height 76 may represent the height of the RF coil cavity that is formed by the RF coil 62 and the front 66, side 68, and rear 70 panes of the RF shield 64. The cavity height 76 may correspond to the radial, or transverse, length of the side panel 68, and may also represent the radial distance from the RF coil 62 and the front shield pane 66 (both of which may be at approximately the same radial distance from the center of the scanner 12) to the rear shield pane 70.

To provide additional space in the imaging volume 18, the cavity height 76 may be made very small relative to the lengths 72 and 74. The cavity height 76 may be, for example, less than 2 cm when the RF shield length 74 is greater than the RF coil length 72. A scanner length 78 may represent the axial length of the scanner 12, which may be, for example, approximately 140 cm, and the imaging volume 18 may have a radius to the inner gradient coil set 58 of approximately 30 cm. Thus, the thin extended-cavity RF coil assembly 32 illustrated in FIG. 2 may occupy approximately 3.3% of the possible imaging volume when the cavity height 76 is approximately 1 cm, rather than occupy approximately 6.7% when the cavity height 76 is 2 cm.

Varying the dimensions of the RF shield 64 may reduce the amount of space the RF coil assembly 32 occupies in the imaging volume 18 while maintaining a desired efficiency. It should be understood that the total magnetic flux in the scanner 12 is approximately proportional to a cross section of the RF coil cavity that is formed by the RF coil 62 and the front 66, side 68, and rear 70 panes of the RF shield 64, multiplied by a current of the RF coil 62. Similarly, the magnetic field at the isocenter is proportional to the total magnetic flux. As such, the coil losses are proportional to a circumference of the RF coil assembly 32, multiplied by current squared. Thus, efficiency may described by the following equation:

$$\text{Efficiency} = \frac{(\text{isocenter\_magnetic\_field})^2}{\text{coil\_losses}}. \quad (1)$$

Due to the relationship described in Equation (1) above, the following equation may be expressed relating RF shield length 74 (L) and cavity height 76 (h) to efficiency:

$$\text{Efficiency} \propto \frac{(L \cdot h)^2}{(L+h)} \approx L \cdot h^2. \quad (2)$$

The RF coil assembly 32 may achieve a given efficiency at an RF shield length 74 and cavity height 76. As shown in Equation (2), the RF coil assembly 32 may maintain the efficiency when the cavity height 76 is halved and the RF shield length 74 is multiplied by four. Rather than maintain an RF shield length 74 of approximately 30 cm and a cavity height 76 of approximately 2-3.5 cm, the cavity height 76 may be reduced to approximately 1 cm, while the RF shield length 72 may be extended to approximately 90 cm, which may cause only a minor reduction in efficiency. Additionally, it should be appreciated that because the thin extended-cavity RF coil assembly 32 does not intersect the gradient coil sets 58 or 60, neither RF uniformity nor imaging volume may be comparably adversely impacted. Moreover, maintaining the RF coil assembly 32 apart from the gradient coil sets 58 or 60 may simplify the construction and installation process.

Figure 3:
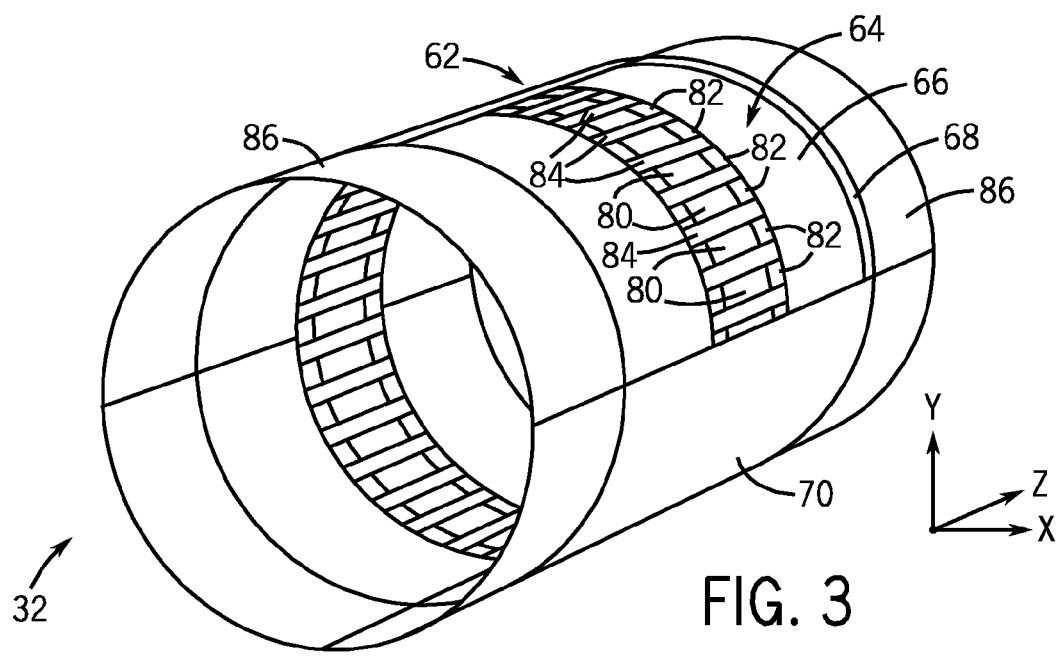
FIG. 3 is a partial cutaway perspective view of the thin extended-cavity radio frequency coil, in accordance with aspects of the invention.

FIG. 3 provides a three-dimensional view of the RF coil assembly 32 in which one of the rear shield panes 70 has been removed to expose elements of the underlying RF coil assembly 32. As shown in FIG. 3, elements of the RF coil assembly 32 include the RF coil 62, which may include a plurality of conductive rungs 80 (e.g., 16 or 32 rungs), which may be connected to capacitive elements 82 and separated by gaps 84, and the RF shield 64, which may include the shield panes 66, 68, and 70. An additional conductive shield extension 86 may be coupled to the outer axial edges of the RF coil assembly 32.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency coil assembly for a magnetic resonance imaging system comprising:
   a radio frequency coil disposed cylindrically around a patient space; and
   a radio frequency shield disposed cylindrically around the patient space and electrically coupled to axial ends of the radio frequency coil, wherein the radio frequency shield is configured to extend behind the radio frequency coil away from the patient space, wherein the axial length of the radio frequency shield is at least two times the axial length of the radio frequency coil.

2. The radio frequency coil assembly of claim 1, wherein a front axial portion of the radio frequency coil and a rear axial portion of the radio frequency shield are separated by a transverse distance of less than two centimeters.

3. The radio frequency coil assembly of claim 2, wherein the transverse distance is approximately one centimeter or less.

4. The radio frequency coil assembly of claim 1, wherein the radio frequency coil assembly does not intersect a gradient coil assembly cylindrically disposed around the patient space.

5. The radio frequency coil assembly of claim 1, wherein the radio frequency coil comprises a plurality of conductive rungs configured to transmit or receive a radio frequency signal.

6. The radio frequency coil assembly of claim 5, wherein the plurality of conductive rungs comprises a total of sixteen rungs.

7. The radio frequency coil assembly of claim 5, wherein the plurality of conductive rungs comprises a total of thirty-two rungs.

8. The radio frequency coil assembly of claim 1, wherein the axial length of the radio frequency shield is at least three times the axial length of the radio frequency coil.

9. The radio frequency coil assembly of claim 1, wherein the axial length of the radio frequency shield is at least four times the axial length of the radio frequency coil.

10. A magnetic resonance imaging system comprising:
a gradient coil assembly disposed cylindrically around a patient space; and
a radio frequency coil assembly disposed cylindrically around the patient space and entirely within the cylinder formed by the gradient coil assembly, wherein the radio frequency coil assembly comprises a first conductive portion nearer to the patient space and a second conductive portion farther from the patient space, wherein the thickness of the radio frequency coil assembly between the first conductive portion and the second conductive portion is less than two centimeters, and wherein the radio frequency coil assembly has a length of greater than 30 centimeters.

11. The system of claim 10, wherein the thickness of the radio frequency coil assembly is approximately one centimeter or less.

12. The system of claim 10, wherein the radio frequency coil assembly comprises a radio frequency coil having a plurality of conductive rungs configured to transmit or receive a radio frequency signal.

13. The system of claim 10, wherein the radio frequency coil assembly comprises an axial radio frequency coil and an axial radio frequency shield, wherein the axial length of the radio frequency shield is at least two times the axial length of the radio frequency coil.

14. The system of claim 13, wherein the axial length of the radio frequency shield is at least three times the axial length of the radio frequency coil.

15. The system of claim 13, wherein the axial length of the radio frequency shield is at least four times the axial length of the radio frequency coil.

16. A magnetic resonance imaging system comprising:
a cylindrical radio frequency coil assembly having a first conductive portion nearer to a patient space of the magnetic resonance imaging system and a second conductive portion farther from the patient space, wherein the thickness of the radio frequency coil assembly between the first conductive portion and the second conductive portion is less than two centimeters, and wherein the radio frequency coil assembly has a length of 30 centimeters or more.

17. The system of claim 16, wherein the thickness of the cylindrical radio frequency coil assembly is approximately one centimeter or less.

18. The system of claim 16, wherein the cylindrical radio frequency coil assembly comprises a radio frequency coil having a plurality of conductive rungs configured to transmit or receive a radio frequency signal.

19. The system of claim 16, wherein the cylindrical radio frequency coil assembly comprises a radio frequency coil and a radio frequency shield, wherein the radio frequency shield is at least twice as long as the radio frequency coil.

20. The system of claim 19, wherein the cylindrical radio frequency coil assembly comprises a radio frequency coil and a radio frequency shield, wherein the radio frequency shield is at least three times as long as the radio frequency coil.

* * * * *